(12) United States Patent
Salling et al.

(10) Patent No.: US 6,858,902 B1
(45) Date of Patent: Feb. 22, 2005

(54) EFFICIENT ESD PROTECTION WITH APPLICATION FOR LOW CAPACITANCE I/O PADS

(75) Inventors: Craig T. Salling, Cupertino, CA (US); Charvaka Duvvury, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/698,633

(22) Filed: Oct. 31, 2003

(51) Int. Cl.[7] .............................................. H01L 23/62
(52) U.S. Cl. ...................... 257/360; 257/361; 257/355; 257/358; 257/359; 257/357; 257/362
(58) Field of Search ................................ 257/360, 361, 257/362, 359; 361/53, 54, 55, 56

(56) References Cited

U.S. PATENT DOCUMENTS

2004/0100745 A1 * 5/2004 Chen et al. .................... 361/56

* cited by examiner

*Primary Examiner*—Nathan J. Flynn
*Assistant Examiner*—Fazli Erdem
(74) *Attorney, Agent, or Firm*—W. James Brady, III; Frederick J. Telecky, Jr.

(57) ABSTRACT

A semiconductor device for ESD protection of an input/output pad (301) of an integrated circuit built in a substrate of a first conductivity type comprising a multi-finger MOS transistor (304), its source (304b) and its gate (304c) connected to ground potential and its drain (304a) connected to the I/O pad. A well of the opposite conductivity type, partially separated from the substrate by shallow trench isolations, has a diode (302), its anode (302b) connected to the pad and also to the transistor drain, and its cathode (302a) connected to power 303). These transistor and diode connections create a parasitic silicon controlled rectifier (SCR) with the SCR-anode (310a) formed by the diode anode, the first base region formed by the well, the second base region formed by the substrate, and the SCR-cathode (311a) formed by the transistor source. The SCR structure provides a significantly lower clamping voltage and an about two times higher failure current than a substrate-pumped MOS transistor.

19 Claims, 8 Drawing Sheets

EFFICIENT ESD PROTECTION WITH APPLICATION FOR LOW CAPACITANCE I/O PADS

FIELD OF THE INVENTION

The present invention is related in general to the field of electronic systems and semiconductor devices and more specifically to the ESD protection for low capacitance and low leakage input/output pads of integrated circuits.

DESCRIPTION OF THE RELATED ART

Integrated circuits (ICs) may be severely damaged by electrostatic discharge (ESD) events. A major source of ESD exposure to ICs is from the human body (described by the "Human Body Model", HBM); the discharge of the human body generates peak currents of several amperes to the IC for about 100 ns. A second source of ESD is from metallic objects (described by the Machine model", MM); it can generate transients with significantly higher rise times and current levels than the HBM ESD source. A third source is described by the "charged device model" (CDM), in which the IC itself becomes charged and discharges to ground in rise times less than 500 ps.

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

The most common protection schemes used in metal-oxide-semiconductor (MOS) ICs rely on the parasitic bipolar transistor associated with an nMOS device whose drain is connected to the pin to be protected and whose source is tied to ground. The protection level or failure threshold can be set by varying the NMOS device width from the drain to the source under the gate oxide of the nMOS device. Under stress conditions, the dominant current conduction path between the protected pin and ground involves the parasitic bipolar transistor of that nMOS device. This parasitic bipolar transistor operates in the snapback region under pin positive with respect to ground stress events.

The dominant failure mechanism, found in the nMOS protection device operating as a parasitic bipolar transistor in snapback conditions, is the onset of second breakdown. Second breakdown is a phenomenon that induces thermal runaway in the device wherever the reduction of the impact ionization current is offset by the thermal generation of carriers. Second breakdown is initiated in a device under stress as a result of self-heating. The peak nMOS device temperature, at which second breakdown is initiated, is known to increase with the stress current level.

The conventional ESD protection approach for an input/output pad 101 in known technology is illustrated in the schematic circuit diagram of FIG. 1. A pn-diode 102 has its cathode 102a connected to power pad 103 (Vdd) for positive ESD stress, and its anode 102b connected to input/output (I/O) pad 101. Another pn-diode 104 has its anode 104b connected to ground potential 105 (Vss) for negative ESD stress, and its cathode 104a to I/O pad 101. The disadvantage of this approach is that the on-resistance of diode 102 determines the effectiveness of this protection; consequently, diode 102 has to be made large, which contradicts the general drive to miniaturize all components. When sufficient voltage builds up, diode 104 goes into reverse breakdown and fails; diode 102, thus, has to be large to handle all positive stress current. Furthermore, diode 104 with its high breakdown may not protect the output nMOS transistor that may have a lower breakdown.

A need has therefore arisen for cost effective design methods to achieve advanced ESD protection, compatible with uniform turn-on, high response speed, low capacitance and low leakage current using standard CMOS processing. The device structures should further provide excellent electrical performance, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

One embodiment of the invention is a semiconductor device for ESD protection of an input/output pad of an integrated circuit (I/C) built in a substrate of a first conductivity type comprising a multi-finger MOS transistor, its source and gate both connected to ground potential and its drain connected to the I/O pad. A well of the opposite conductivity type, partially separated from the substrate by shallow trench isolations, has a diode, its anode connected to the pad and also to the transistor drain, and its cathode connected to power. These transistor and diode connections create a parasitic silicon controlled rectifier (SCR) with the SCR-anode formed by the diode anode, the first base region formed by the well, the second base region formed by the substrate, and the SCR-cathode formed by the transistor source. The SCR structure provides a significantly lower clamping voltage and an about two times higher failure current than a substrate-pumped MOS transistor.

Another embodiment of the invention is a semiconductor device for ESD protection of an input/output pad of an integrated circuit (I/C) built in a substrate of a first conductivity type comprising a multi-finger MOS transistor, its source and gate both connected to ground potential and its drain connected to power. A first well and a second well of the opposite conductivity type are made in the substrate, partially separated from the substrate by shallow trench isolations. The first well has a first diode, its anode connected to the pad and its cathode connected to power. These connections of the MOS transistor and the first diode create a parasitic silicon controlled rectifier (SCR) with the SCR-anode formed by the first diode anode, the first base region formed by the first well, the second base region formed by the substrate, and the SCR-cathode formed by the transistor source. The second well has a second diode, its anode connected to ground potential and its cathode connected to the pad.

The embodiments of the invention specify the conditions for SCR operation, as distinct from substrate-pumped MOS protection, and embodiments that will reliably achieve the desired condition for SCR operation. Experimental confirmation of the SCR operation is provided by a comparison of the I-V characteristics of the SCR and a substrate-pumped MOS transistor. The SCR action occurs independent of wafer doping, in one embodiment by surrounding the diode-nMOS structure with an annular region in which the p-well implant has been blocked, in another embodiment by using a diode-nMOS spacing less than 5 $\mu$m. Both of these features achieve a large and uniform substrate bias to reliably turn on the SCR of the diode-nMOS structure during an ESD event.

In the embodiment of the invention, latch-up of the diode-MOS structure during normal operation is prevented by enclosing the protection circuit with a guard-ring connected to ground potential (Vss). In certain embodiments, this guard-ring may be p+/nwell; its width is empirically set to prevent latch-up of the ESD circuit.

It is a technical advantage of the invention that the diode-MOS structure for ESD protection has lower capacitance and lower leakage current compared to conventional protection structures.

It is an additional advantage that the embodiments of the invention can be made smaller because they provide a higher ESD failure current.

Additional technical advantages of the invention are that the embodiments are easy to manufacture and that they are robust against latch-up during normal operation.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
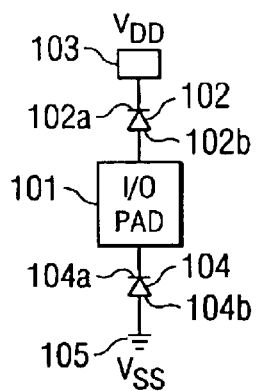
FIG. 1 is a schematic circuit diagram of the ESD protection of an integrated circuit input/output pad in known technology.

The impact if the present invention can be most easily appreciated by highlighting the shortcomings of the known approaches to provide protection against ESD events on input/output (I/O) pads of integrated circuits (IC). Compared to the ESD protection shown in FIG. 1, with diode 102 effective for positive stress and diode 104 for negative stress, an approach in known technology for improved protection device efficiency is presented in the schematic circuit diagram of FIG. 2. 201 designates the I/O pad to be protected. For positive ESD stress, diode 202 is effective, which has its cathode 202a connected to power terminal 203 (Vdd) and its anode 202b to pad 201. Connected to pad 201 is the drain 204a of MOS transistor 204. The source 204b of transistor 204 is tied to ground potential 205 (Vss); gate 204c of transistor 204 is also tied to ground 205, through resistor 206. For negative ESD stress, the parasitic diode 207 (with pad 201 as cathode and ground Vss 205 as anode) of transistor 204 offers protection.

Figure 2:
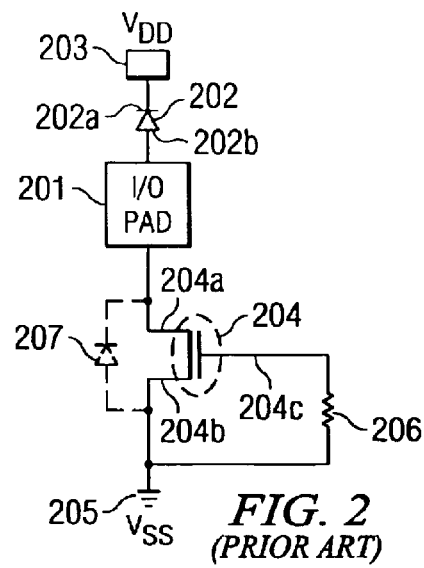
FIG. 2 is a schematic circuit diagram of an improved ESD protection of an integrated circuit input/output pad in known technology.

In many devices, the substrate is p-type; consequently, diode 202 is built in an n-well and is a pn-diode, and the MOS transistor 204 is nMOS. In the device of FIG. 2, the vertical pnp of diode 202 pumps current into the substrate of transistor 204, triggering it as an efficient npn device. The efficiency of this protection depends on the capacitance associated with power terminal 203, since, if it is too small, the vertical pnp shuts off before the HBM event, causing premature failure in transistor 204.

Figure 3:
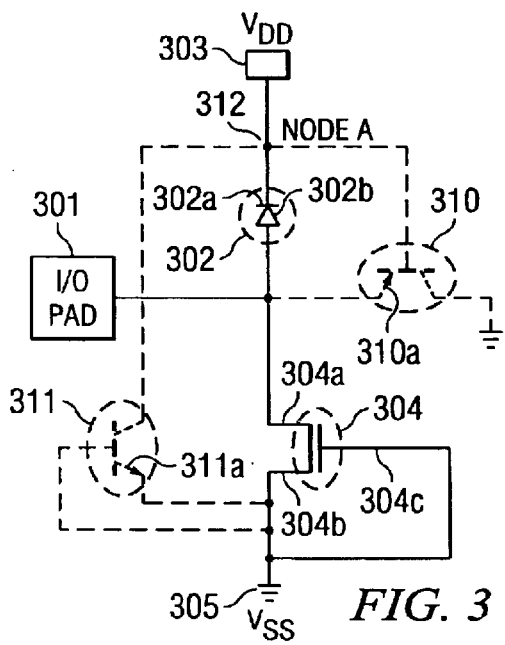
FIG. 3 is a schematic circuit diagram of an embodiment of the invention to create ESD protection for an input/output pad by forming a parasitic silicon controlled rectifier.

FIG. 3 displays a schematic circuit diagram of an embodiment of the present invention. 301 designates the I/O pad to be protected against ESD events. The device for protection is in a semiconductor substrate of a first conductivity type. A multi-finger MOS transistor 304 is in that substrate and has the regions for a source 3014b connected to ground potential (Vss, 305), a gate 304c connected to ground potential 305, and a drain 304a connected to pad 301.

In the substrate of the first conductivity type is a well of the opposite conductivity type. This well is laid out so that it is positioned in proximity to the regions of the MOS transistor. In the well is at least one diode 302. It has an anode region 302b of the first conductivity type, connected to I/O pad 301 and the transistor drain 304a; further, diode 302 has a cathode region 302a of the opposite conductivity type, connected to power terminal 303 (Vdd). The layout is executed so that the diode-anode 302b is positioned in proximity to the source region 304b, and the diode-cathode 302a is positioned in proximity to the drain region 304a (more detail in FIG. 10).

Based on the proximity layout of the transistor and diode regions and the electrical connections, a localized parasitic silicon-controlled rectifier (SCR) is created. In the embodiment of FIG. 3, the parasitic SCR is indicated by its pnp transistor portion 310 and its npn transistor portion 311, interconnected by dashed lines. It comprises an SCR-anode 310a formed by the diode-anode 302b; a first base region formed by the well; a second base region formed by the substrate; and an SCR-cathode 311a formed by the transistor source 304b. In this parasitic SCR, the node A, designated as 312, is the same as power terminal 303 (Vdd). The I/O pad becomes the SCR-anode, and ground potential 305 (Vss) becomes the SCR-cathode.

The parasitic SCR offers efficient ESD protection because it is operable to distribute an ESD current at low voltages. In the embodiment of FIG. 3, no guard ring is placed between diode 302 and transistor 304 to trigger the SCR; however in the embodiment of FIG. 9, the additional benefit of a guard ring is pointed out. A further layout advantage of the embodiment of FIG. 3 is the fact that the gate 304c of MOS transistor 304 does not need a resistor to ground potential 305 (as was necessary by resistor 206 of the prior art in FIG. 2), since the successful ESD protection of FIG. 3 does not depend on an efficient npn device, which is essential in the prior art of FIG. 2.

For many applications, the first conductivity type referenced above is p-type and the opposite conductivity type is n-type. With this selection, the semiconductor substrate mentioned above is a p-type substrate, the MOS transistor an nMOS transistor, the diode a pn-diode, and the silicon-controlled rectifier a pnpn-SCR. It should be stressed, though, that all considerations for the embodiments of the present invention are valid in applications where the conductivity types are inversed.

Figure 4:
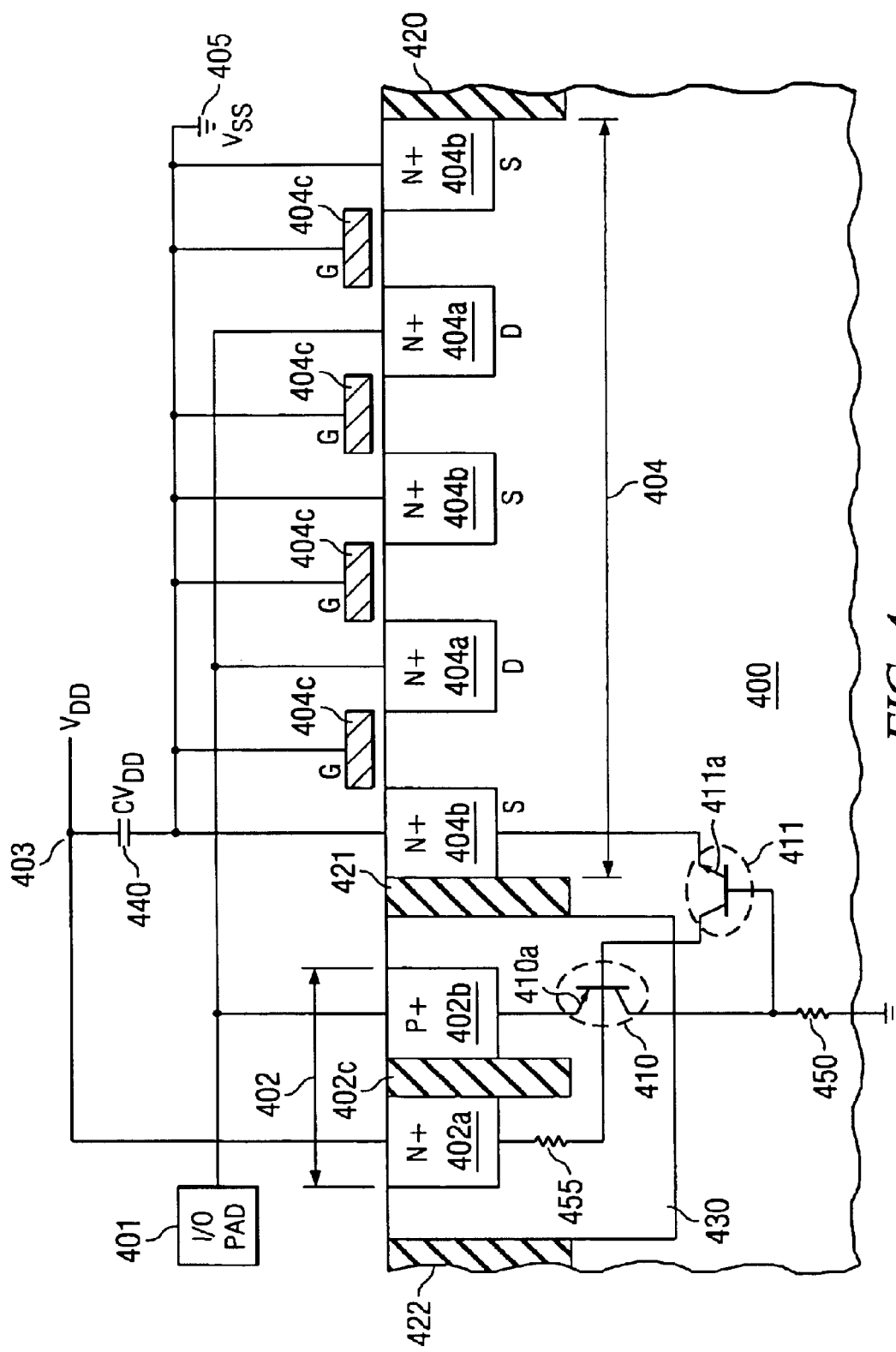
FIG. 4 illustrates a schematic cross section of a portion of an integrated circuit chip according to the embodiment of FIG. 3, showing the component regions and their relative placement and interconnections for creating the ESD protection for an input/output pad by forming a parasitic silicon controlled rectifier.

The embodiment of FIG. 3 is illustrated in more detail in the schematic cross section of FIG. 4, specifically for the case of the first conductivity type being p-type. In the p-type substrate 400 (often a p-well), a multi-finger nMOS transistor 404 has been fabricated between the shallow trench isolations 420 and 421. One plurality of n+ regions 404a serves as transistor drains, connected to I/O pad 401. Another plurality of n+ regions 404b serves as transistor sources, connected to ground potential 405 (Vss). The gates 404c are also connected to ground potential 405 (Vss).

Inserted in substrate 400, and isolated by shallow trench isolations 421 and 422, is a well 430 of the opposite conductivity type; in the example of FIG. 4, well 430 has n-type conductivity. Due to the thinness of the trench isolation 421, well 430 is in proximity to transistor 404 (more detail in FIG. 10). Inside the well is at least one diode 402, formed by the n+ cathode 402a and the p+ anode 402b. Shallow trench isolation 402c separates cathode 402a and anode 402b. Cathode 402a is tied to power 403 (Vdd), anode 402b is tied to I/O pad 401 and also to transistor drain 404a. The chip capacitance Cvdd between Vdd 403 and Vss is designated 440.

Due to the proximity of diode 402 to transistor 404, a localized parasitic silicon rectifier is formed, consisting of pnp transistor 410 coupled to npn transistor 411. The SCR has the SCR-anode 410a, formed by the diode anode 402b, and the SCR-cathode 411a, formed by the transistor source 404b. The first base region is formed by the n-well 430, the second base region by the p-substrate 400. The substrate resistance to ground potential is designated 450; it is, of course, determined by the substrate resistivity and the length of electrical path to ground and shapes the current-voltage characteristic of the SCR. The n-well resistance is designated 455.

Figure 5:
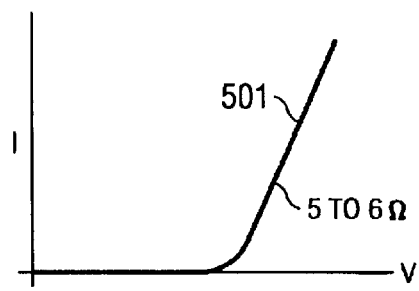
FIG. 5 shows the current-voltage characteristic of a typical nMOS transistor.
Figure 6:
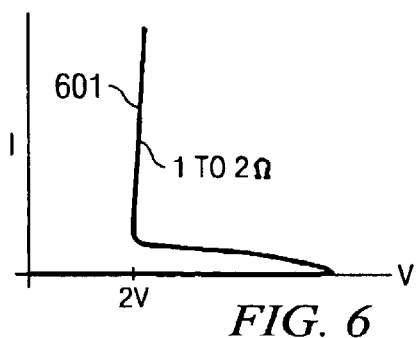
FIG. 6 shows the current-voltage characteristic of a component SCR.
Figure 7:
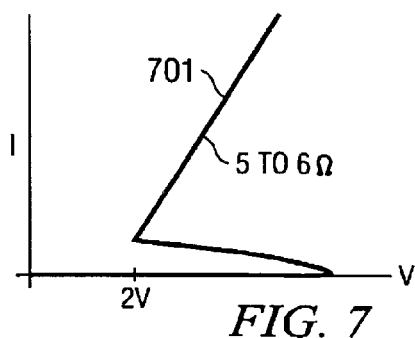
FIG. 7 shows the current-voltage characteristic of the parasitic SCR of the invention as a combination of the characteristics of FIGS. 5 and 6.

The current-voltage characteristic of the parasitic SCR can, in principle, be construed by combining the I-V characteristic of an nMOS transistor (FIG. 5, about 5 to 6 Ω on-resistance slope in curve portion 501) with the I-V characteristic of a component SCR (FIG. 6, curve 601, about 1 to 2 Ω on-resistance slope in curve portion 601). FIG. 7 depicts schematically the I-V characteristic of the parasitic SCR (on-resistance slope of 5 to 6 Ω in curve portion 701).

Figure 8:
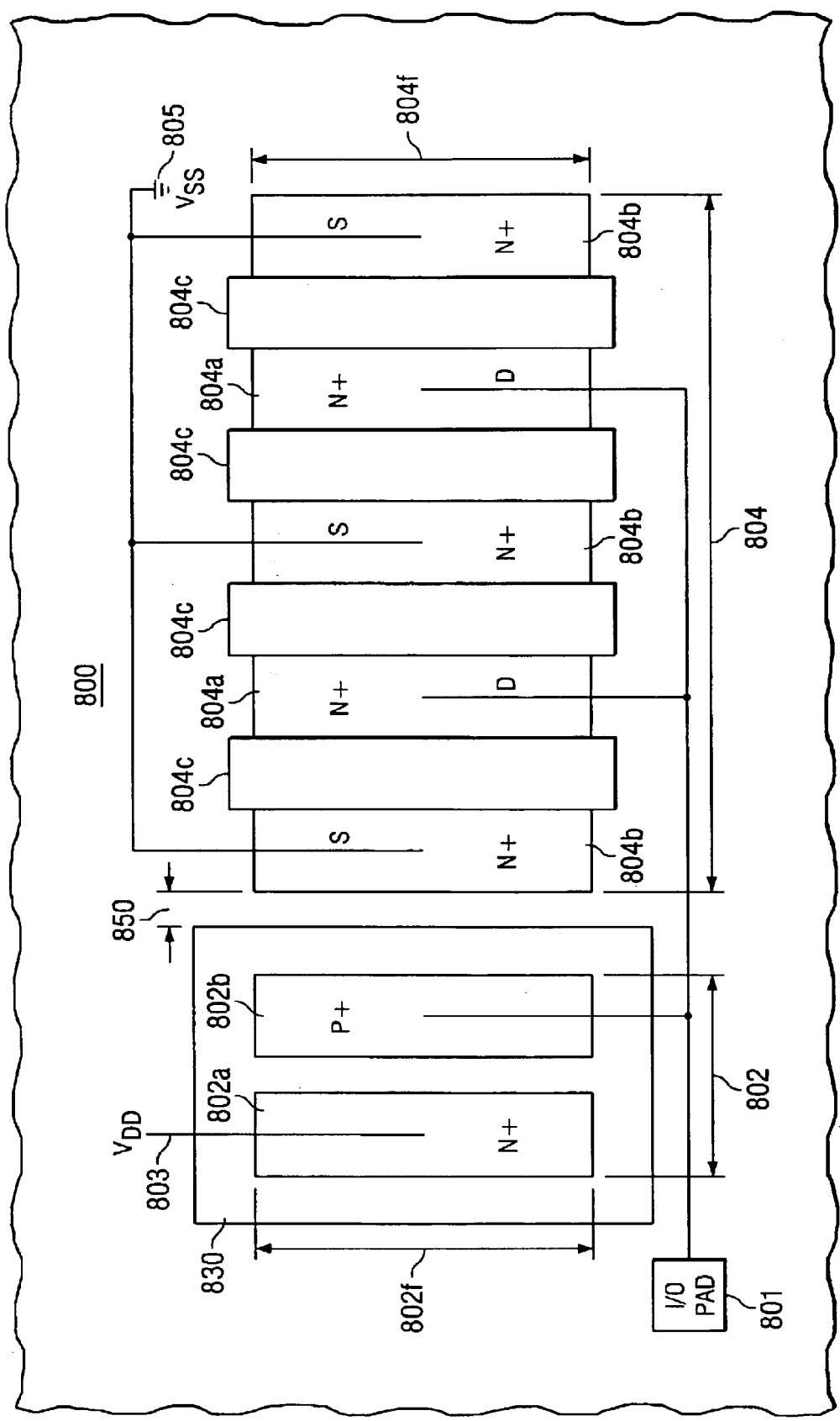
FIG. 8 illustrates a schematic top view of a portion of an integrated circuit chip showing an MOS transistor and a diode with interconnection as an embodiment of the invention.
Figure 9:
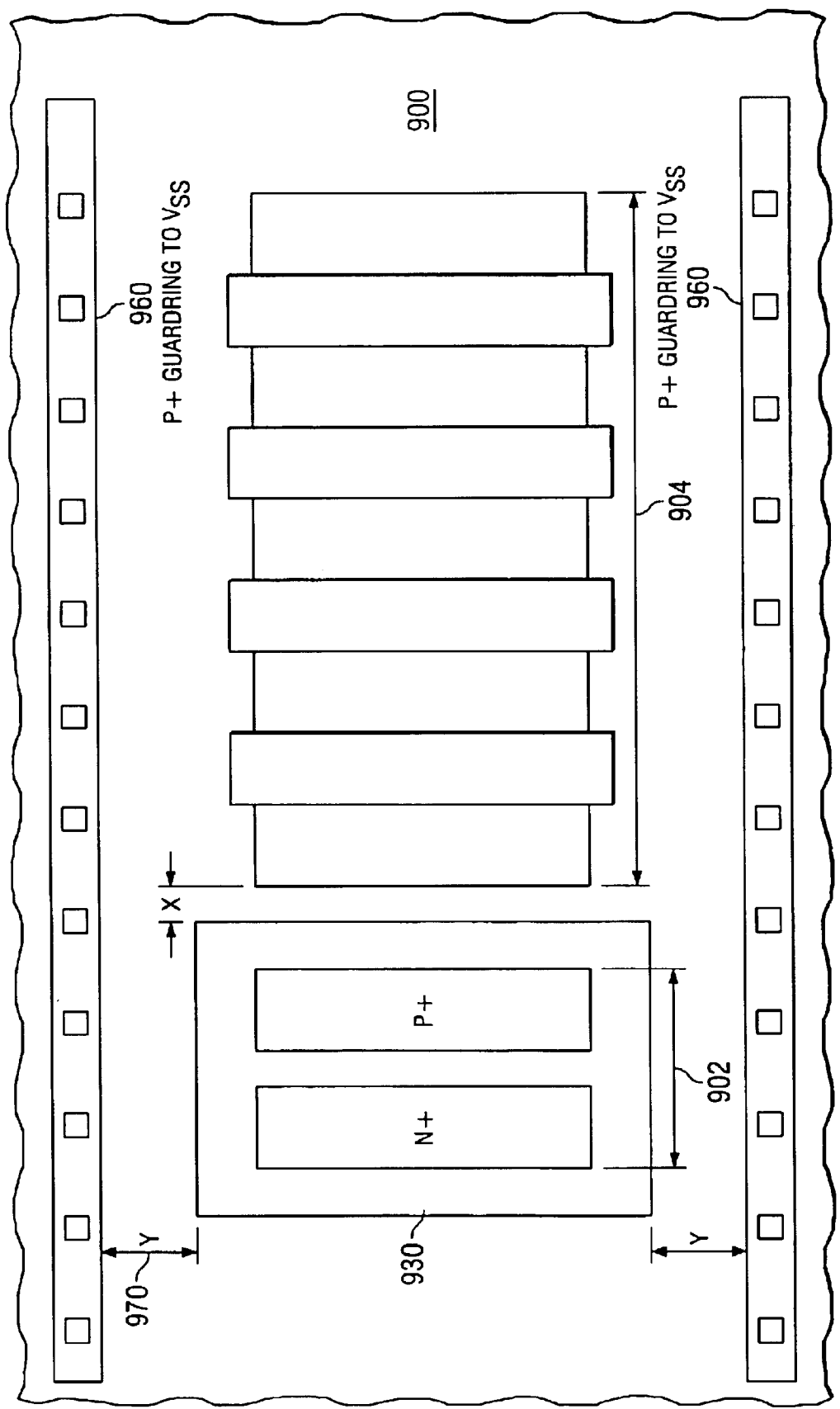
FIG. 9 illustrates a schematic top view of a portion of an integrated circuit chip showing an MOS transistor, a diode and a guard ring with interconnection as another embodiment of the invention.
Figure 10:
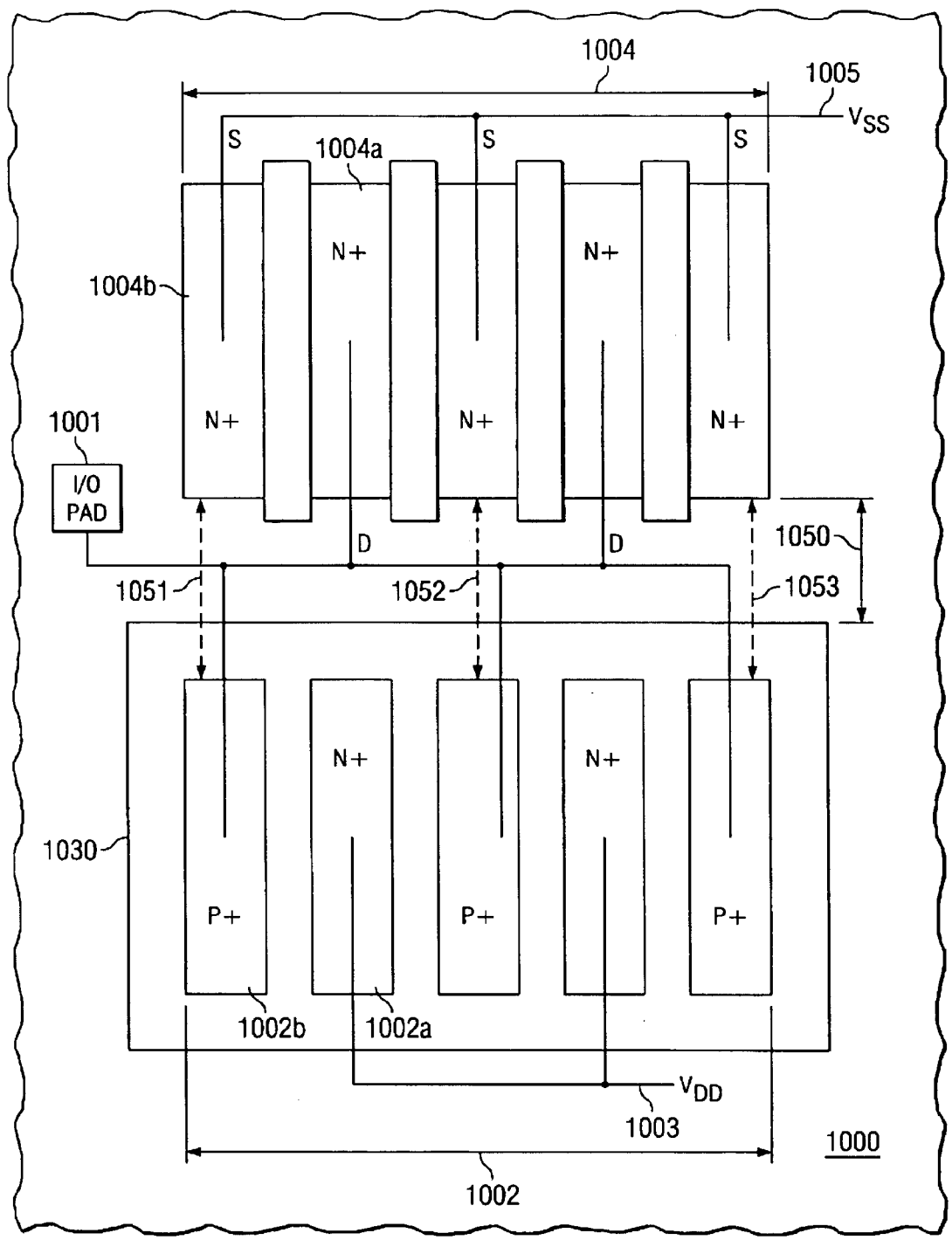
FIG. 10 illustrates a schematic top view of a portion of an integrated circuit chip showing the layout of an MOS transistor and a diode with interconnection as another embodiment of the invention.

The schematic and simplified top views of FIGS. 8, 9 and 10 discuss the circuit layout of the embodiment of the present invention. In FIG. 8, the substrate 800 has conductivity of a first type; a preferred example is p-type in the sheet resistance range from about 200 to 500 Ω/□ (the selection of the substrate resistivity determines the size of the substrate resistance 450 in FIG. 4). In the example of FIG. 8, 804 is the multi-finger nMOS transistor. It has n+ drain regions 804a connected to pad 801, and source n+ regions tied to ground potential (Vss) 805; the gate metallizations 804c are also tied to ground (not shown in FIG. 8). As a simple calculation to determine the nMOS transistor layout, the discharge of the 4 kV of the HBM requires, at the empirical HBM performance of 10 V/$\mu$m for a substrate-pumped transistor, an active transistor length of 400 $\mu$m. Source and drain regions are designed to typically have individual lengths 804f of typically 40 $\mu$m; consequently, 10 gates are needed. If transistor 804 were to handle the ESD event as a substrate-pumped MOS clamp, the transistor area for these source/drain lengths would result, at 1.5 V/$\mu$m$^2$, in a capacitance of about 500 fF.

FIG. 8 further shows the diode 802 to be designed together with transistor 804 according to the embodiment of the invention. Diode 802 is in n-well 830 and has n+ cathode 802a, tied to power (Vdd) 803, and p+ anode 802b, tied to I/O pad 801. Diode anode and cathode have the length 802f, which is the same as the length 804f of the transistor regions; as in the above example, the length 804f is typically 40 $\mu$m (as shown in FIG. 10, diode 802 may be laid out with multi-region anode and cathode). The distance 850 is controlled to allow the SCR trigger for the ESD discharge, rather than discharge by substrate-pumped MOS (distance 850 is about 2 to 5 $\mu$m, see more detail in FIG. 10). The advantage of the SCR operation for discharging an ESD current is highlighted by comparing an SCR layout with the above layout for the MOS transistor. The discharge the 4 kV of the HBM requires, at the empirical HBM performance of 100 V/$\mu$m for an SCR, an active transistor length of 40 $\mu$m. With source and drain length 804f of typically 40 $\mu$m, only one gate as a minimum can be used. The transistor area for this length results, at 3 to 4 V/$\mu$m$^2$, in a capacitance as low as about 100 fF.

Another degree of freedom for the layout of the embodiment is discussed in the schematic top view of FIG. 9. In the example of FIG. 9, substrate 900 is p-type and transistor 904 is nMOS. Diode 902 is in n-well 930. A p+ guard ring 960 to Vss is placed at a distance 970 from transistor and diode in order to confine the substrate resistance and obtain the desired resistance. As an example, for a substrate sheet resistance between 200 to 500 Ω/□, distance 970 is typically between 5 and 20 μm. The distance 950 between diode 902 and transistor 904 is controlled to allow the trigger of the parasitic SCR; for substrate sheet resistances between 200 and 500 Ω/□, distance 904 is preferably less than 5 μm and typically between 2 and 5 μm.

The schematic top view of FIG. 10 displays an embodiment, which has in p-type substrate 1000 a multi-finger transistor 1004 and an n-well 1030 with a diode 1002 in a one-on-one design layout. First of all, transistor 1004 and n-well 1030 are in close proximity, separated only by the small distance 1050 (for instance, less than 5 μm), so that the formation of localized parasitic SCR units are enabled. Secondly, in this layout each n+ region of the transistor is aligned with a region of the diode, alternatively a p+ region and an n+ region. This alignment results in the conduction paths of the SCRs, which are indicated in FIG. 10 by the dashed arrows. As an example, n+ region 1004b, serving as a source region and tied to ground potential 1005 (Vss), is aligned with p+ region 1002b, serving as a diode anode region and tied to I/O pad 1001. Based on this alignment, indicated by arrow 1051, p+ region 1002b, and thus the I/O pad, becomes the SCR anode and n+ region 1004 band thus ground Vss, becomes the SCR cathode. n+ region 1004a, serving as a drain region and tied to I/O pad 1001, is aligned with n+ region 1002a, serving as a diode cathode region and tied to power 1003 (Vdd). In the example of FIG. 10, the SCR conduction paths resulting from the layout alignment are repeated two more times across the multi-finger components and indicated by arrows 1052 and 1053. The multiple appearance of the SRC function and the multiple SCR current paths render the ESD-dissipating capability of the layout in FIG. 10 very efficient and area-thrifty, in particular without the need for a large area diode, a large Vdd-to-Vss capacitance (CVdd), or a guard ring for support of substrate pumping.

Figure 11:
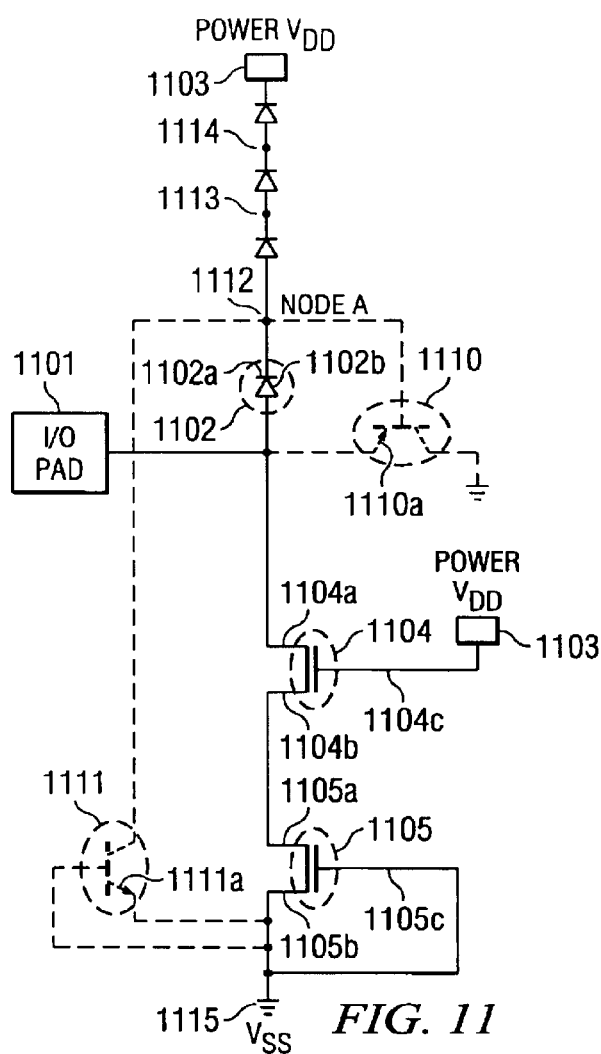
FIG. 11 is a schematic circuit diagram of another embodiment of the invention to create ESD protection for an input/output pad of a voltage-tolerant circuit by forming a parasitic silicon controlled rectifier.
Figure 12:
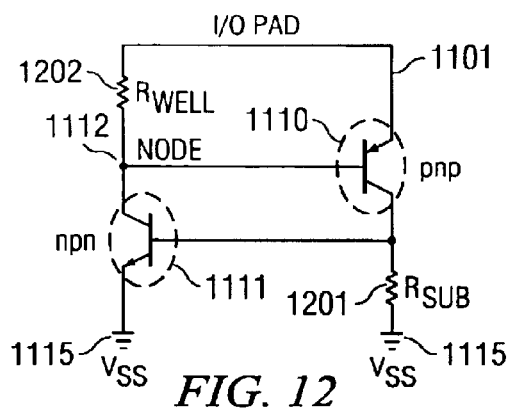
FIG. 12 displays the parasitic SCR portion of the circuit in FIG. 11.
Figure 13:
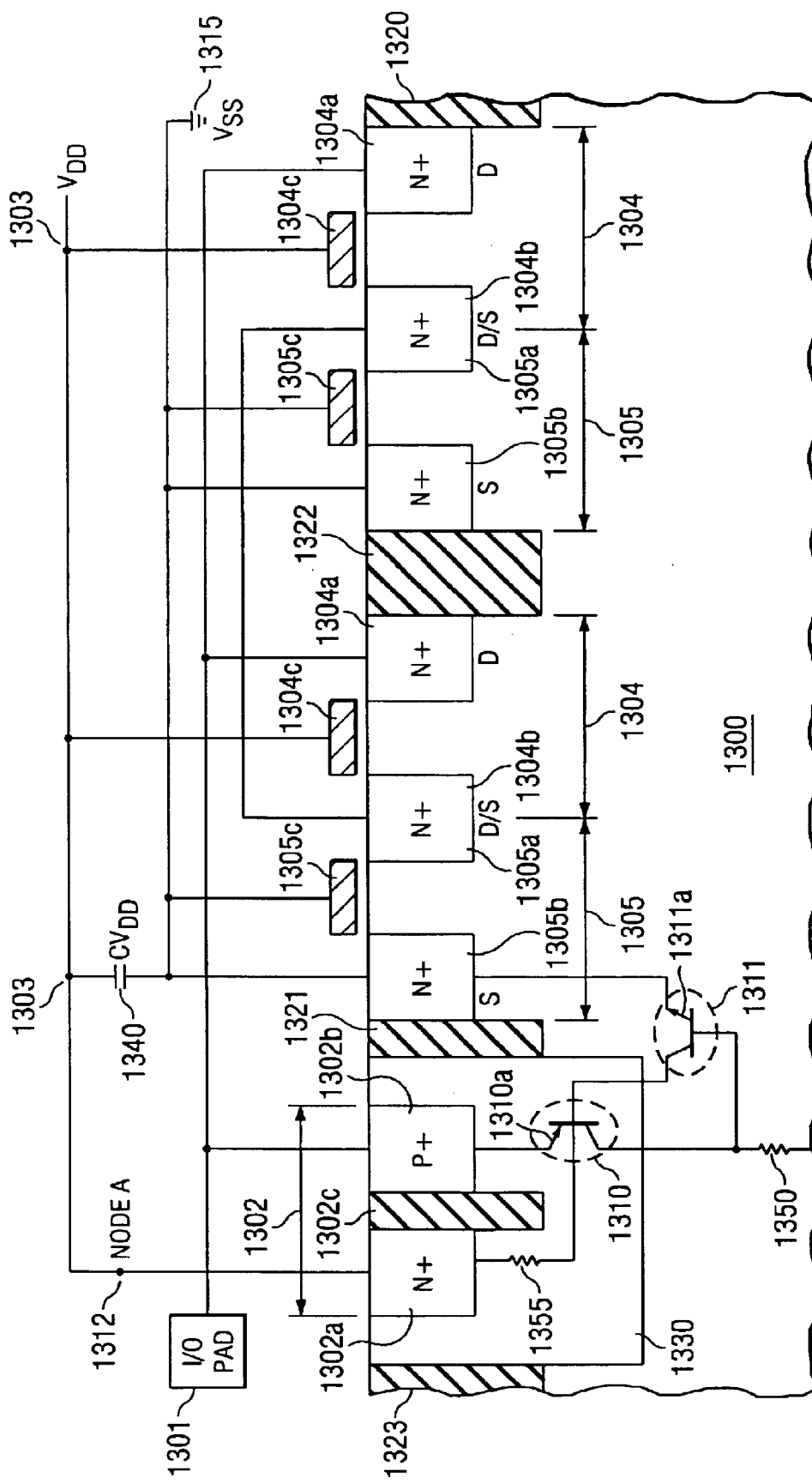
FIG. 13 illustrates a schematic cross section of a portion of an integrated circuit chip according to the embodiment of FIG. 11, showing the component regions and their relative placement and interconnections for creating the ESD protection for an input/output pad by forming a parasitic silicon controlled rectifier.

Another embodiment of the present invention is discussed in FIGS. 11, 12, and 13. FIG. 11 depicts a schematic circuit diagram of cascoded transistors suitable for voltage-tolerant ESD protection. 1101 designates the I/O pad to be protected against ESD events. The devices for protection are in a semiconductor substrate of a first conductivity type. A first MOS transistor 1104 has the drain 1104a connected to pad 1101, the source 1104b connected to the drain 1105a of the second transistor 1105, and the gate 1104c connected to the power terminal 1103 (Vdd). A second MOS transistor 1105 has the source 1105b connected to ground potential 1115 (Vss), and the gate 1105c also connected to ground potential 1115.

In the substrate of the first conductivity type is laid well of the opposite conductivity type. This well is laid out so that it is positioned in proximity to the regions of the MOS transistor. In the well is at least one diode 1102. It has an anode region 1102b of the first conductivity type, connected to I/O pad 1101 and the drain 1104a of the first transistor 1104; further, diode 1102 has a cathode region 1102a of the opposite conductivity type, connected either to power terminal 1103 (Vdd) or, as shown in FIG. 11, to the anode of a second diode in series with the first one. The layout is executed so that the diode-anode 1102b is positioned in proximity to the source region 1105b of the second transistor, and the diode-cathode 1102a is positioned in proximity to the drain region 1104a of the first transistor (more detail in FIG. 13).

Based on the proximity layout of the transistor and diode regions and the electrical connections, a localized parasitic silicon-controlled rectifier (SCR) is created. In the embodiment of FIG. 11, the parasitic SCR is indicated by its pnp transistor portion 1110 and its npn transistor portion 1111, interconnected by dashed lines. It comprises an SCR-anode 1110a formed by the diode-anode 1102b; a first base region formed by the well; a second base region formed by the substrate; and an SCR-cathode 1111a formed by the second transistor source 1105b. In this parasitic SCR, the node A designated as 1112, is a high impedance node and can lead to SCR trigger. The I/O pad becomes the SCR-anode, and ground potential 1105 (Vss) becomes the SCR-cathode.

For many applications, the first conductivity type referenced above is p-type and the opposite conductivity type is n-type. With this selection, the semiconductor substrate mentioned above is a p-type substrate, the MOS transistor an nMOS transistor, the diode a pn-diode, and the silicon-controlled rectifier a pnpn-SCR. It should be stressed, though, that all considerations for the embodiments of the present invention are valid in applications where the conductivity types are inversed.

In FIG. 11, the node A designated 1112 of the parasitic SCR, is positioned so that it includes only the first diode of a string of diodes into the SCR and thus makes the vertical pnp transistor portion most efficient. Other node positions in the string of diodes, such as 1113 or 1114, would diminish the vertical pnp portion of the SCR.

The parasitic SCR offers efficient ESD protection because it is operable to distribute an ESD current at low voltages and does not depend on substrate pumping for triggering transistors 1104 and 1105. As stated above in conjunction with FIGS. 9 and 10, among the design options to control the effective local substrate resistance, needed to trigger the parasitic SCR, are a guard ring, or a modified substrate resistivity, a special p-well separate from the p-substrate.

The schematic circuit diagram of FIG. 12 highlights the components and structure of the parasitic SCR shown as dashed lines in FIG. 11. Corresponding designation numbers refer to identical entities. FIG. 12 shows the pnp transistor portion 1110 and the npn transistor portion 1111 of the pnpn SCR as they are tied to I/O pad 1101, ground potential 1115, and node 1112. Further included in FIG. 12 are the p-substrate resistance 1201 and the n-well resistance 1202; they can be controlled separately to optimize the SCR efficiency (the resistors are shown in FIG. 13).

The schematic cross section of FIG. 13 illustrates the embodiment of FIG. 11 specifically for the case of the first conductivity type being p-type. In the p-type substrate 1300 (often a p-well), the cascoded two-finger nMOS transistors 1304 and 1305 have been fabricated between shallow trench isolations 1320, 1321, and 1322. One plurality of n+ regions 1304a of the first transistor 1304 serves as transistor drains, connected to I/O pad 1301. Another plurality of n+ regions 1304b of the first transistor serves as transistor sources, connected to the drains 1305a of the second transistor 1305. The gates 1304c of the first transistor are connected to power terminal 1303 (Vdd). The second transistor 1305 has a plurality of n+ regions serving as sources 1305b, connected to ground potential 1315 (Vss), and the gates 1305c also tied to ground potential 1315.

Inserted in substrate 1300, and isolated by shallow trench isolations 1321 and 1323, is a well 1330 of the opposite conductivity type (n-type). Due to the thinness of the trench isolation 1321, well 1330 is near second transistor 1305 (approximately 2 to 5 μm). Inside the well is at least one diode 1302, formed by the n+ cathode 1302a and the p+ anode 1302b (compared to FIG. 11, only the first diode to node 1312 is shown). Shallow trench isolation 1302c separates cathode 1302a and anode 1302b. Cathode 1302a is tied to node 1312 and power 1303 (Vdd), anode 1302b is tied to I/O pad 1301 and also to first transistor drain 1304a. The chip capacitance Cvdd between Vdd 1303 and Vss 1315 is designated 1340.

Due to the proximity of diode 1302 to second transistor 1305, a localized parasitic silicon rectifier is formed, consisting of pnp transistor 1310 coupled to npn transistor 1311. The SCR has the SCR-anode 1310a, formed by the diode anode 1302b, and the SCR-cathode 1311a, formed by the second transistor source 1304b. The first base region is formed by the n-well 1330, the second base region by the p-substrate 1300. The substrate resistance to ground potential is designated 1350; it is, of course, determined by the substrate resistivity and the length of electrical path to ground and shapes the current-voltage characteristic of the SCR. The n-well resistance is designated 1355.

Figure 14:
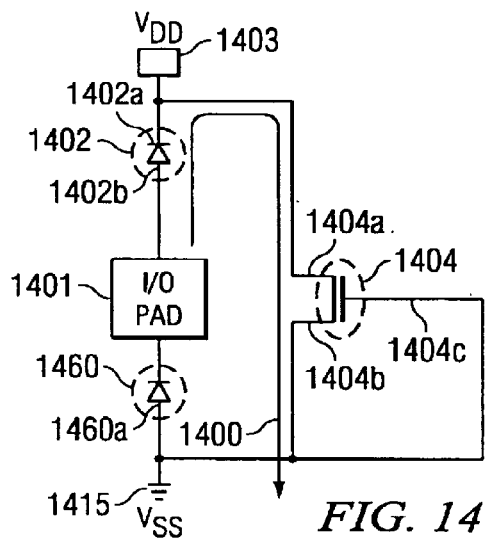
FIG. 14 is a schematic circuit diagram of another embodiment of the invention to create ESD protection for an input/output pad by forming a parasitic silicon controlled rectifier.
Figure 15:
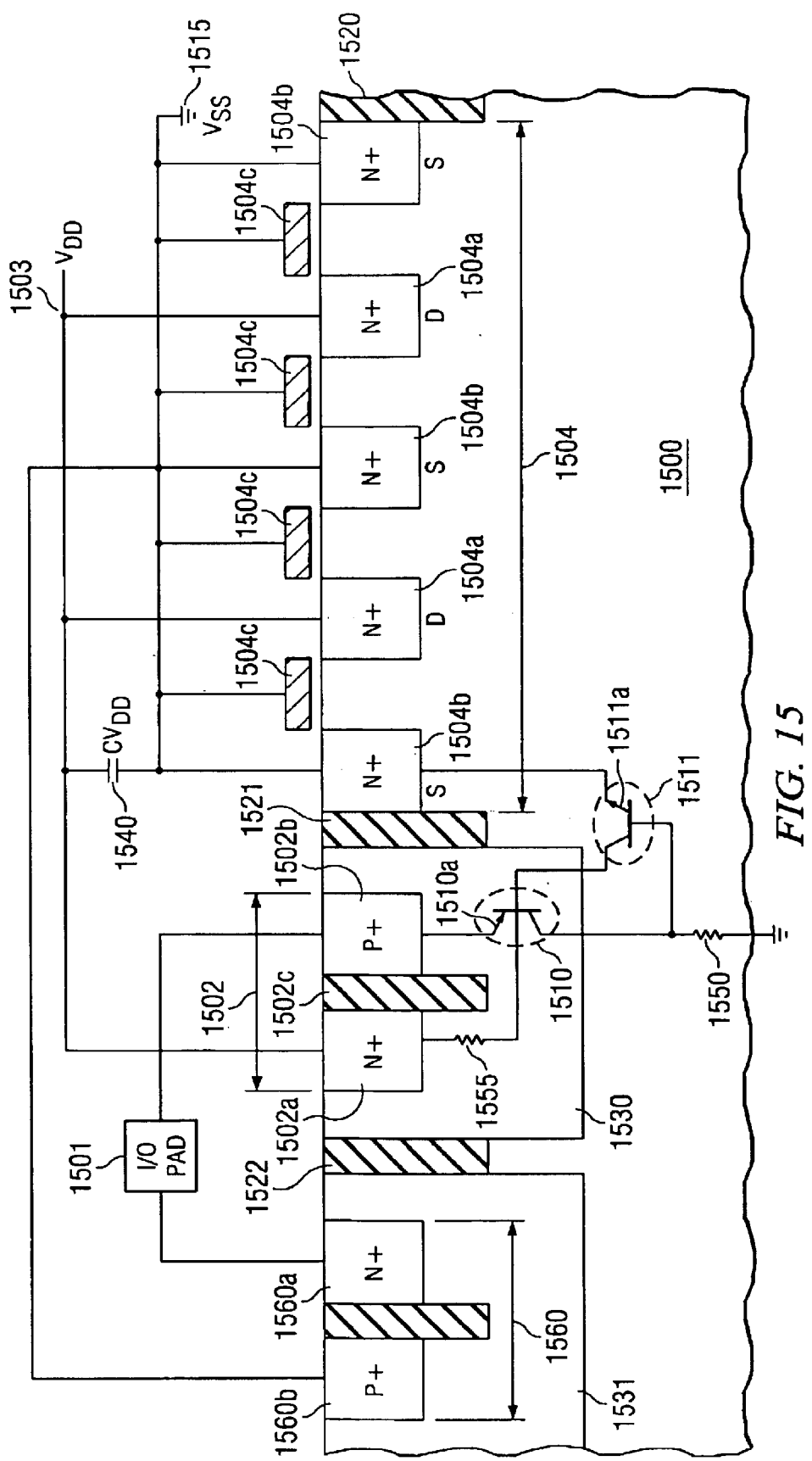
FIG. 15 illustrates a schematic cross section of a portion of an integrated circuit chip according to the embodiment of FIG. 14, showing the component regions and their relative placement and interconnections for creating the ESD protection for an input/output pad by forming a parasitic silicon controlled rectifier.

Another embodiment of the present invention is shown in the schematic circuit diagram of FIGS. 14 and 15. For the initial part of a positive ESD stress hitting I/O pad 1401, a first pn-diode 1402 is used; the diode has its anode 1402b tied to pad 1401 and its cathode 1402a connected to power pad 1403 (Vdd). For the remaining part of the ESD stress, diode 1402 supports either the substrate pumping of MOS transistor 1404, or it forms, together with MOS transistor 1404, a parasitic SCR device, as described in more detail in FIG. 15. MOS transistor 1404 is shown with its drain 1404a tied to power 1403 (Vdd), and with its source 1404b and gate 1404c connected to ground (Vss). Arrow 1400 symbolizes the formation of the SCR in FIG. 14. For negative ESD stress hitting pad 1401, the second pn-diode 1460 forms the protection device. Diode 1460 has its anode 1460a connected to ground potential 14415 (Vss). It is a technical advantage of the embodiment in FIG. 14 that the voltage at the I/O pad 1401 does not reach a value, which would cause reverse breakdown of the second diode 1460. Consequently, the embodiment of FIG. 14 is a better ESD protection device than conventional methods for outputs 1401, which require no series resistors. Moreover, with the high efficiency of the SCR function, a smaller protection size than in standard technology is sufficient to achieve safe ESD protection level; therefore, the device in FIG. 14 offers a lower Vdd-to-Vss capacitance.

The schematic cross section of FIG. 15 illustrates the embodiment of FIG. 14 specifically for the case of an ESD protection device fabricated in a p-type substrate 1500. A multi-finger nMOS transistor 1504 has been fabricated between the shallow trench isolations 1520 and 1521. One plurality of n+ regions 1504a serves as transistor drains, connected to power terminal 1403 (Vdd). Another plurality of n+ regions 1504b serves as transistor sources, connected to ground potential 1515 (Vss). The gates 1504c are also connected to ground potential 1515 (Vss).

Inserted in substrate 1500, and isolated by shallow trench isolations 1521 and 1522, are two wells 1530 and 1531 of the opposite conductivity type (n-type). Due to the thinness of the trench isolation 1521, the first well 1530 is in proximity to transistor 1504 (approximately 2 to 5 µm). Inside the well is diode 1502, formed by the n+ cathode 1502a and the p+ anode 1502b. Shallow trench isolation 1502c separates cathode 1502a and anode 1502b. Cathode 1502a is tied to power 1503 (Vdd) and thus also to transistor drains 1504a, anode 1502b is tied to I/O pad 1501. The chip capacitance Cvdd between Vdd 1503 and Vss 1515 is designated 1540.

Due to the proximity of diode 1502 to transistor 1504, a localized parasitic silicon rectifier is formed, consisting of pnp transistor 1510 coupled to npn transistor 1511. The SCR has the SCR-anode 1510a, formed by the diode anode 1502b, and the SCR-cathode 1511a, formed by the transistor source 1504b. The first base region is formed by the first n-well 1530, the second base region by the p-substrate 1500. The substrate resistance to ground potential is designated 1550; it is, of course, determined by the substrate resistivity and the length of electrical path to ground and shapes the current-voltage characteristic of the SCR. The n-well resistance is designated 1555.

Inside the second well 1531 is the second diode 1560, formed by the n+ cathode 1560a, tied to I/O pad 1501, and p+ anode 1560b, tied to ground 1515 (Vss) and thus to transistor source 1504b.

Figure 16:
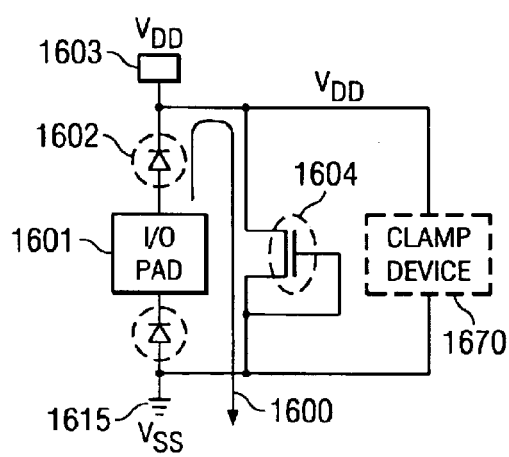
FIG. 16 is a schematic circuit diagram of yet another embodiment of the invention to create ESD protection for an input/output pad by forming a parasitic silicon controlled rectifier.

Another embodiment of the present invention is displayed in the schematic circuit diagram of FIG. 16, which displays an ESD protection circuit for I/O pad 1601. The embodiment in FIG. 16 is related to the embodiment shown in FIG. 14 in that the local clamp MOS transistor 1604 is used together with first diode 1602 to form a parasitic SCR, symbolized by the arrow 1600. However, an additional clamp device 167Q is employed for direct ESD stress between power 1603 (Vdd) and ground 1615 (Vss). This addition supports the protection against Vdd to I/O stress and also takes care of standard Vdd to Vss stress.

Figure 17:
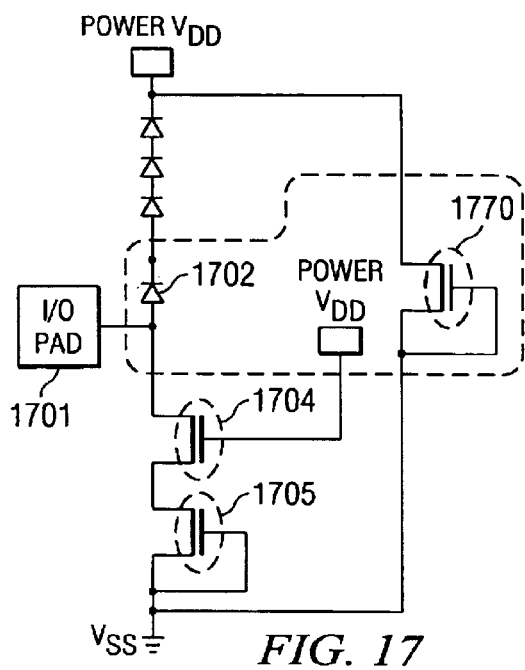
FIG. 17 is a schematic circuit diagram of yet another embodiment of the invention to create ESD protection for an input/output pad by forming a parasitic silicon controlled rectifier.

FIG. 17 illustrates an embodiment for protecting voltage-tolerant pins 1701, which is related to the embodiments discussed in FIGS. 11 and 16. In the embodiment of FIG. 17, the parasitic SCR is formed between diode 1702 and MOS transistor 1770. The two transistors 1704 and 1705 form the cascode for the voltage-tolerant function.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the embodiments are effective in pMOS transistors as well as in nMOS transistors to create ESD protection. As another example, the substrate material may include silicon, silicon germanium, gallium arsenide and other semiconductor materials employed in manufacturing. As yet another example, the concept of the invention is effective for many semiconductor device technology nodes and not restricted to a particular one. It is therefore intended that the appended claims encompass any such modifications or embodiments.

We claim:

1. A semiconductor device for protecting an integrated circuit input/output pad against ESD events, comprising:

a substrate of a first conductivity type, said substrate having a resistivity;

a multi-finger MOS transistor in said substrate, said MOS transistor comprising a source region, connected to ground potential, a gate region, connected to ground potential, and a drain region, connected to said pad;

a well of the opposite conductivity type in said substrate, said well positioned in close proximity to said transistor regions;

an interdigitated diode in said well, said diode having a plurality of anode regions of said first conductivity type, connected to said pad and said drain, and a plurality of cathode regions of said opposite conductivity type, connected to power;

each transistor region aligned with a corresponding diode region such that said diode-anode regions are positioned at a close proximity to said source regions, and said diode-cathode regions positioned at said close proximity to said drain regions;

each of said transistor and diode regions, respectively, coupled by said proximity and said connections, creating a localized parasitic silicon-controlled rectifier (SCR) comprising an SCR-anode formed by said diode-anode, a first base region formed by said well, a second base region formed by said substrate, and an SCR-cathode formed by said transistor source, said SCR operable to distribute an ESD current at low voltage.

2. The device according to claim 1 wherein said first conductivity type is p-type and said opposite conductivity type is n-type.

3. The device according to claim 2 wherein said substrate is a p-type substrate, said MOS transistor an nMOS transistor, said diode a pn-diode, and said silicon controlled rectifier a pnpn-SCR.

4. The device according to claim 1 wherein said proximity comprises a distance selected for SCR effectiveness in conjunction with said substrate resistivity.

5. The device according to claim 4 wherein said proximity comprises a distance of less than 5 µm for substrate sheet resistances in the range from about 200 to 500 Ω/□.

6. The device according to claim 1 wherein said MOS transistor is interconnected as a cascode for voltage tolerant protection, said cascoded MOS transistor having a cascode-source, connected to ground potential, and a cascode-drain, connected to said pad.

7. The device according to claim 1 wherein said at least one diode determines said proximity for efficient SCR functionality.

8. The device according to claim 1 further comprising a guard ring at a certain distance from said transistor and said diode, said guard ring connected to ground potential and operable to provide the local substrate resistance, based on said substrate resistivity, of said SCR to ground potential.

9. The device according to claim 8 wherein said guard ring provides an effective substrate resistance between about 50 and 500 Ω.

10. A semiconductor device for ESD protection of an input/output pad, comprising:

a substrate of a first conductivity type said substrate having a resistivity;

a multi-finger MOS transistor in said substrate, said MOS transistor comprising a source region, connected to ground potential, a gate region, connected to ground potential, and a drain region, connected to power;

a first well of the opposite conductivity type in said substrate, said well positioned in close proximity to said transistor regions;

a first interdigitated diode in said first well, said first diode having a plurality of first anode regions of said first conductivity type, connected to said pad, and a plurality of first cathode regions of said opposite conductivity type, connected to power;

each transistor region aligned with a corresponding first diode region such that said first diode-anode regions are positioned at a close proximity to said source regions, and said first diode-cathode regions positioned at said close proximity to said drain regions;

each of said transistor and first diode regions, respectively, coupled by said proximity and said connections, creating a localized parasitic silicon-controlled rectifier (SCR) comprising an SCR-anode formed by said first diode anode, a first base region formed by said first well, a second base region formed by said substrate, and an SCR-cathode formed by said transistor source;

a second well of the opposite conductivity type in said substrate; and a second diode in said second well, said second diode having a second anode, connected to ground potential, and a second cathode, connected to said pad.

11. The device according to claim 10 further comprising an additional clamp between said power and said ground potential to protect against direct ESD stress.

12. The device according to claim 10 wherein said first conductivity type is p-type and said opposite conductivity type is n-type.

13. The device according to claim 12 wherein said substrate is a p-type substrate, said MOS transistor an NMOS transistor, said first and second diodes pn-diodes, and said silicon controlled rectifier a pnpn-SCR.

14. The device according to claim 10 wherein said proximity comprises a distance selected for SCR effectiveness in conjunction with said substrate resistivity.

15. The device according to claim 14 wherein said proximity comprises a distance of less than 5 µm for substrate resistivities in the range from about 200 to 500 Ωcm.

16. The device according to claim 10 wherein said MOS transistor is interconnected as a cascode for voltage tolerant protection, said cascoded MOS transistor having a cascode-source, connected to ground potential, and a cascode-drain, connected to said pad.

17. The device according to claim 10 wherein said first diode determines said proximity for efficient SCR functionality.

18. The device according to claim 10 further comprising a guard ring at a certain distance from said transistor and said diode, said guard ring connected to ground potential and operable to provide the local substrate resistance, based on said substrate resistivity, of said SCR to ground potential.

19. The device according to claim 18 wherein said guard ring provides an effective substrate resistance between about 50 to 500 Ω.

* * * * *